(12) United States Patent
Dunn et al.

(10) Patent No.: US 7,303,968 B2
(45) Date of Patent: Dec. 4, 2007

(54) SEMICONDUCTOR DEVICE AND METHOD HAVING MULTIPLE SUBCOLLECTORS FORMED ON A COMMON WAFER

(75) Inventors: James S. Dunn, Jericho, VT (US); Louis D. Lanzerotti, Burlington, VT (US); Steven H. Voldman, South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 117 days.

(21) Appl. No.: 11/299,682

(22) Filed: Dec. 13, 2005

(65) Prior Publication Data
US 2006/0157824 A1   Jul. 20, 2006

Related U.S. Application Data

(62) Division of application No. 09/991,142, filed on Nov. 16, 2001, now Pat. No. 7,064,416.

(51) Int. Cl.
*H01L 21/8222* (2006.01)
*H01L 21/331* (2006.01)
*H01L 21/8249* (2006.01)

(52) U.S. Cl. ............... 438/318; 438/309; 438/312; 438/320; 438/234; 438/172; 438/189; 438/489; 257/565; 257/566; 257/575; 257/580; 257/582; 257/E21.387; 257/E21.696

(58) Field of Classification Search ............... 438/309, 438/312, 318, 320, 234, 172, 189, 489; 257/565, 257/566, 575, 580, 582
See application file for complete search history.

(56) References Cited

U.S. PATENT DOCUMENTS

| | | |
|---|---|---|
| 3,573,573 A | 4/1971 | Moore |
| 3,735,481 A | 5/1973 | Makimoto |
| 3,761,898 A | 9/1973 | Pao |
| 3,846,192 A | 11/1974 | Murman |
| 3,930,909 A | 1/1976 | Schmitz et al. |
| 4,038,680 A | 7/1977 | Yagi et al. |
| 4,202,006 A | 5/1980 | Khajezadeh |
| 4,258,379 A | 3/1981 | Watanabe et al. |
| 4,301,382 A | 11/1981 | Kameyama |
| 4,641,419 A | 2/1987 | Kudo |
| 4,694,321 A | 9/1987 | Washio et al. |
| 4,826,780 A | 5/1989 | Takemoto et al. |
| 4,921,811 A | 5/1990 | Watanabe et al. |
| 4,940,671 A | 7/1990 | Small et al. |
| 5,045,493 A | 9/1991 | Kameyama et al. |

(Continued)

FOREIGN PATENT DOCUMENTS

JP   63-288055   11/1988

(Continued)

*Primary Examiner*—Michael Lebentritt
*Assistant Examiner*—Mohsen Ahmadi
(74) *Attorney, Agent, or Firm*—Connolly Bove Lodge & Hutz LLP; Anthony Canale

(57) ABSTRACT

A semiconductor device and a method of fabricating a semiconductor device having multiple subcollectors which are formed in a common wafer, in order to provide multiple structures having different characteristic and frequency response are provided. The subcollectors may be provided using different doses or different material implants resulting in devices having different optimum unity current gain cutoff frequency ($f_T$) and breakdown voltage ($BV_{CEO}$ and $BV_{CBO}$) on a common wafer.

4 Claims, 24 Drawing Sheets

SiGe HBT TRANSISTOR

U.S. PATENT DOCUMENTS

| | | | |
|---|---|---|---|
| 5,185,274 A * | 2/1993 | Chang et al. | 438/314 |
| 5,245,209 A | 9/1993 | Ishigaki | |
| 5,286,997 A | 2/1994 | Hill | |
| 5,481,132 A | 1/1996 | Moreau | |
| 5,506,427 A | 4/1996 | Imai | |
| 5,633,179 A | 5/1997 | Kamins et al. | |
| 5,648,279 A | 7/1997 | Imai | |
| 5,719,066 A | 2/1998 | Sano et al. | |
| 5,798,560 A | 8/1998 | Ohkawa et al. | |
| 5,856,695 A | 1/1999 | Ito et al. | |
| 5,892,264 A | 4/1999 | Davis et al. | |
| 6,268,640 B1 | 7/2001 | Park et al. | |
| 6,365,447 B1 | 4/2002 | Hebert et al. | |
| 6,392,307 B1 | 5/2002 | Okawa et al. | |
| 6,396,107 B1 | 5/2002 | Brennan et al. | |
| 6,403,463 B1 * | 6/2002 | Suyama | 438/622 |
| 6,436,782 B2 | 8/2002 | Chantre et al. | |
| 6,559,517 B2 * | 5/2003 | Zhu | 257/591 |
| 2002/0000640 A1 * | 1/2002 | Zhu | 257/565 |
| 2006/0065936 A1 * | 3/2006 | Kerr et al. | 257/378 |

FOREIGN PATENT DOCUMENTS

| | | |
|---|---|---|
| JP | 03-125476 | 5/1991 |

\* cited by examiner

ESD Results of Sb SiGe Varactor Structure vs As SiGe Varactor (No pedestal)

| Varactor Width (um) | Varactor Length (1 um) | POR As Subcollector HBM Results POSITIVE HBM PULSE | Sb Subcollector HBM Results POSITIVE HBM PULSE |
|---|---|---|---|
| 0.32 | 1.0 | 270-300V | 400-700V |
| 0.32 | 2.1 | 360-390V | 500-600V |
| 0.32 | 4.2 | 510-570V | 800V |
| 0.32 | 8.4 | 540-900V | 1100-1300V |
| 0.32 | 16.8 | 570-1560V | 1300-2100V |
| 0.32 | 33 | 540-570V | 3500-3700V |
| 0.32 | 50 | 2610-2670V | 3700-4300V |
| 0.44 | 50 | 2700-2800V | 4000-4200V |

FIG.24

ESD Results of Sb SiGe Varactor Structure vs As SiGe Varactor (No pedestal)

| Varactor Width (um) | Varactor Length (1 um) | POR As Subcollector HBM Results | Sb Subcollector HBM Results |
|---|---|---|---|
| 0.32 | 1.0 | 120-150V | 300-800V |
| 0.32 | 2.1 | 120V | 300-600V |
| 0.32 | 4.2 | 120-150V | 300V |
| 0.32 | 8.4 | 150V | 200-300V |
| 0.32 | 16.8 | 150V | 300-700V |
| 0.32 | 33 | 150V | 300-900V |
| 0.32 | 50 | 150V | 400-1400V |
| 0.44 | 50 | 150V | 400-2100V |

SEMICONDUCTOR DEVICE AND METHOD HAVING MULTIPLE SUBCOLLECTORS FORMED ON A COMMON WAFER

This application is a divisional of U.S. patent application Ser. No. 09/991,142, filed Nov. 16, 2001 now U.S. Pat. No. 7,064,416

FIELD OF INVENTION

The present invention relates to a semiconductor device and a method of fabricating a chip with bipolar transistors having different optimum unity current gain cutoff frequency ($f_T$) and/or breakdown voltage (BVCEO and BVCBO),

BACKGROUND OF THE INVENTION

Currently, bipolar transistors are utilized in a mad of high frequency communications applications. Many bipolar transistors feature a buried subcollector to assist in the collection of carriers while reducing series resistance. See e.g. U.S. Pat. No. 5,286,997, "METHOD FOR FORMING AN ISOLATED, LOW RESISTANCE EPITAXIAL SUBCOLLECTOR FOR BIPOLAR TRANSISTORS," issued Feb. 15, 1994 to Hill and assigned to Texas Instruments.

More recently, higher switching speeds have been achieved by utilizing heterojunction bipolar transistors (HBT's), in which bipolar transistor elements are formed in graded SiGe or SiGeC layers that enhance carrier mobility. See e.g. U.S. Pat. No. 5,633,179, "METHOD OF FORMING SILICON/SILICON-GERMANIUM HETEROJUNCTION BIPOLAR TRANSISTOR," issued May 27, 1997 to Kamins et al. See e.g. U.S. Pat. No. 5,506,427, "HETEROJUNCTION BIPOLAR TRANSISTOR WITH SILICON-GERMANIUM BASE," issued Apr. 9, 1996 to Imai and assigned to NEC Corporation.

Another alternative that has developed is BiCMOS, which attempts to combine the high frequency operations of bipolars with the low power attributes of CMOS. See e.g. U.S. Pat. No. 5,856,695, "BICMOS DEVICES," issued Jan. 5, 1999 to Ito et al., and assigned to Harris Corporation.

SUMMARY OF THE INVENTION

The inventors have discerned situations in which it would be advantageous to vary the optimum unity current gain cutoff frequency ($f_T$) and/or breakdown voltage (BVCEO and BVCBO) for bipolar transistors on a common wafer. Since according to the Johnson limit the relationship between $f_T$ and BVCBO are interrelated, the semiconductor devices resulting from the present invention may be designed to take full advantage of the interrelationship.

In a first aspect, the present invention is a semiconductor wafer comprising a first device having a first subcollector; and a second device having a second subcollector, wherein the second subcollector differs from said first subcollector.

In a second aspect, the present invention is a first and second bipolar transistors formed on a p-substrate, said first transistor comprising a Sb subcollector; a n-epi collector; a SiGe polysilicon p-doped extrinsic base; a SiGe silicon single crystal intrinsic base; and said second transistor comprising: an As subcollector; a n-epi collector; a SiGe polysilicon extrinsic base; and a SiGe Si single crystal extrinsic base.

In a third aspect, the present invention is a method of manufacturing a semiconductor device on a wafer comprising the steps of forming a subcollector region by implantation of the wafer with a first dopant and with a second dopant; forming an isolation structure on the subcollector region; forming a SiGe film or SiGeC film on the wafer surface for formation of a transistor base region; forming an emitter structure on the SiGe or SiGeC film.

Still other objects and advantages of the present invention will become readily apparent by those skilled in the art from the following detailed description, wherein it is shown and described only the preferred embodiments of the invention, simply by way of illustration of the best mode contemplated of earring out the invention. As will be realized the invention is capable of other and different embodiments, and its several details are capable of modifications in various obvious respects, without departing from the invention. Accordingly, the description to be regarded as illustrative in nature and not as restrictive.

BRIEF DESCRIPTIONS OF THE DRAWINGS

The above-mentioned objects and advantages of the present invention will be more clearly understood when considered in conjunction with the accompanying drawings, in which:

FIG. 24 shows the ESD results of an Sb SiGe varactor structure versus an Arsenic (As) SiGe varactor for a positive HBM pulse.

FIG. 25 shows the ESD results of an Sb SiGe varactor structure versus an Arscenic (As) SiGe varactor for a negative HBM pulse.

DESCRIPTION OF PREFERRED EMBODIMENTS

In order to facilitate an understanding of the different embodiments of the present invention, reference will be made to the figures which illustrate a diagrammatic representation of the steps of the different embodiments of the present invention.

FIGS. 1-16 show the process steps for manufacturing one embodiment of a semiconductor device of the present invention.

Radio frequency products need enhanced ESD protection to achieve a good $f_T$ and $f_{MAX}$ device characteristics. The present invention provides a device and manufacturing method for providing multiple npn SiGe transistors, varactors, and Schottky diode structures with different subcollectors for functional and ESD advantages for SiGe technology.

For RF products there is also a need to provide devices having high breakdown voltages, ESD robust elements and low capacitance. The inventors have found that semiconductor process doping concentrations and design dimensions can have a significant influence on the high pulse current and ESD sensitivities of SiGe semiconductor devices. More specifically, the inventors have found that by controlling collector lateral ballasting ESD linearity may be improved.

Figure 1:
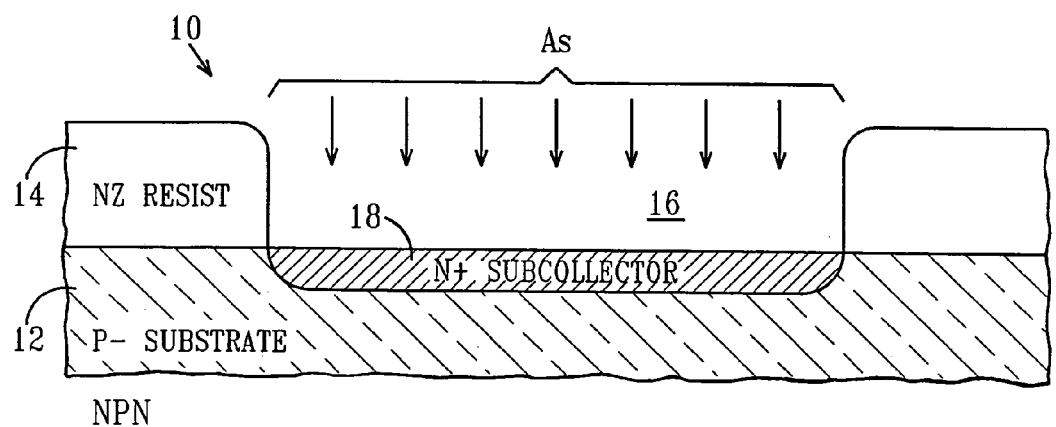
FIGS. 1-16 are schematic diagrams showing a segmented view of a device illustrating in different steps of the fabrication process one embodiment of the present invention.
Figure 2:
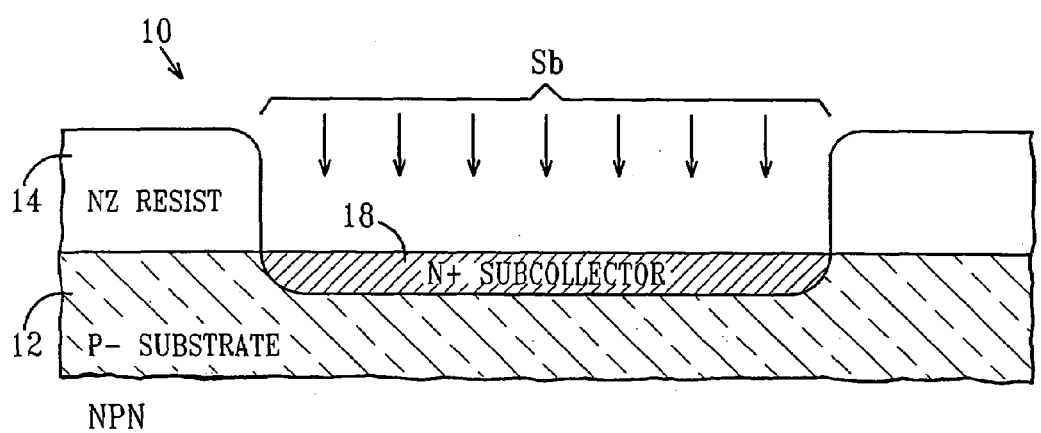

According to one embodiment of the present invention, a semiconductor wafer 10 is provided. The semiconductor wafer 10, is typically silicon, for instance a P− type single crystal silicon substrate, but can be any semiconductor material. FIG. 1 shows a P− substrate 12 upon which a photoresist layer 14 is formed. A portion of the resist layer 14 is removed forming a region 16 that exposes the P− substrate 12. A first dopant Arsenic (As) is implanted forming an N+ first subcollector region 18. FIG. 2 shows that a second dopant Antimony (Sb) is then implanted into the first subcollector region 18.

Figure 3:
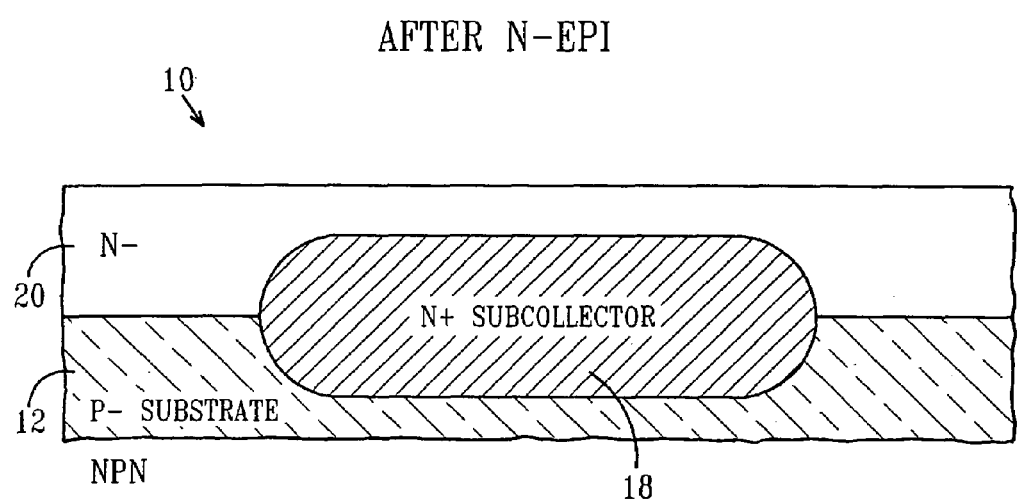
Figure 4:
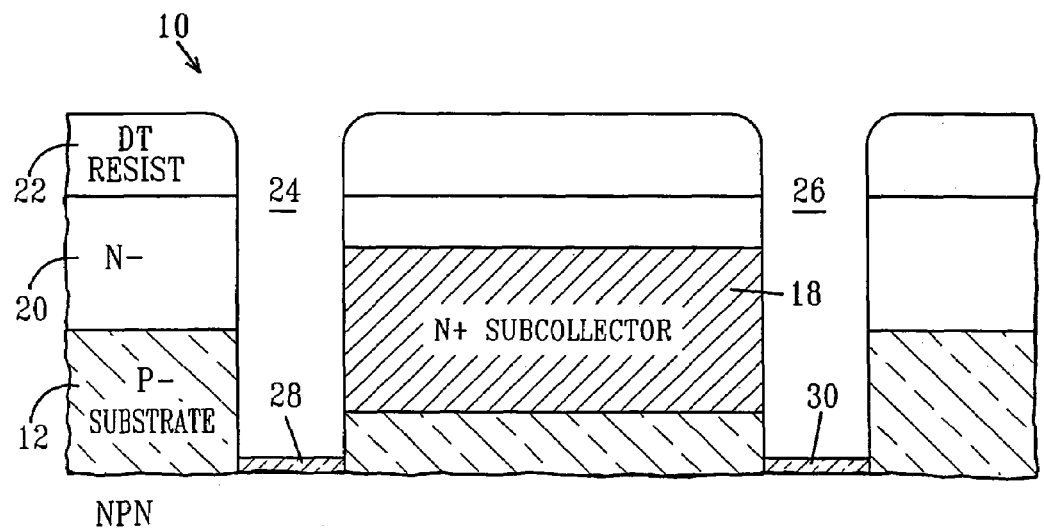

FIG. 3 shows the results of an N− epitaxial silicon growth step which includes an N− layer 20 formed over the P− substrate 12 and the N+ first subcollector region 18. Note that this epitaxial silicon is not required for the invention. A mask including a resist layer 22 is then formed over the N− layer 20 as shown in FIG. 4. Two deep trenches 24, 26 may then be etched adjacent the boundaries of the N+ subcollector 18 in the resist layer 22 using RIE methods that remove silicon. Arsenic is then implanted with the resist 22 still in place to form channel stop regions 28, 30 at the bottom of each trench. Note these channel stops are not shown in subsequent figures for ease of illustration. The substrate is then oxidized to form oxide layers 32, 34 on the sidewalls of trenches 24, 26. The structure is subjected to brief blanket RIE to remove oxide from the bottom of the trenches as well as the upper surface of the substrate. Then a blanket layer of polysilicon is deposited to fill the trenches with poly 36, 38 as shown in FIG. 5, and the polysilicon above the trenches is removed using well known chemical-mechanical planarization techniques.

Figure 5:
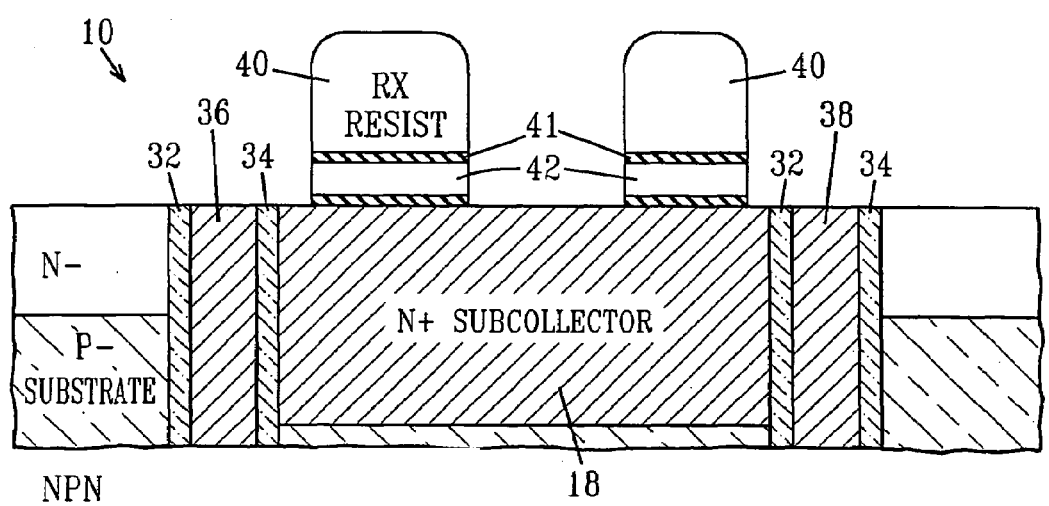
Figure 6:
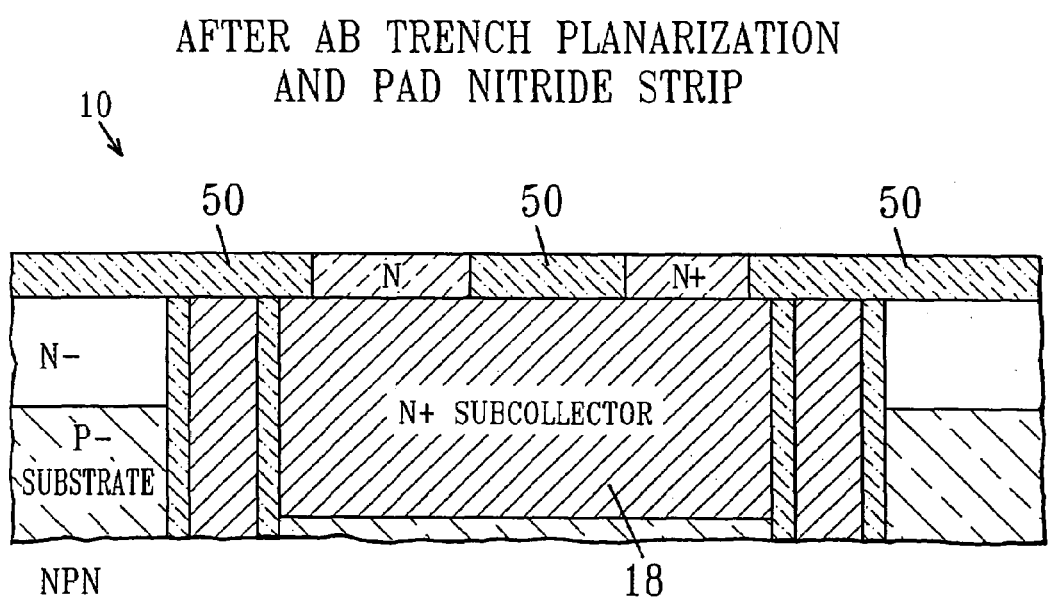

FIG. 5 shows a mask including a resist layer 40 (including a pad nitride layer 41) is then formed over the semiconductor wafer 10. The exposed portions of the wafer 10 are then etched to form silicon islands 42 above the N+ first subcollector region 18. FIG. 6 shows the semiconductor wafer 10 after the trench planarization.

Figure 7:
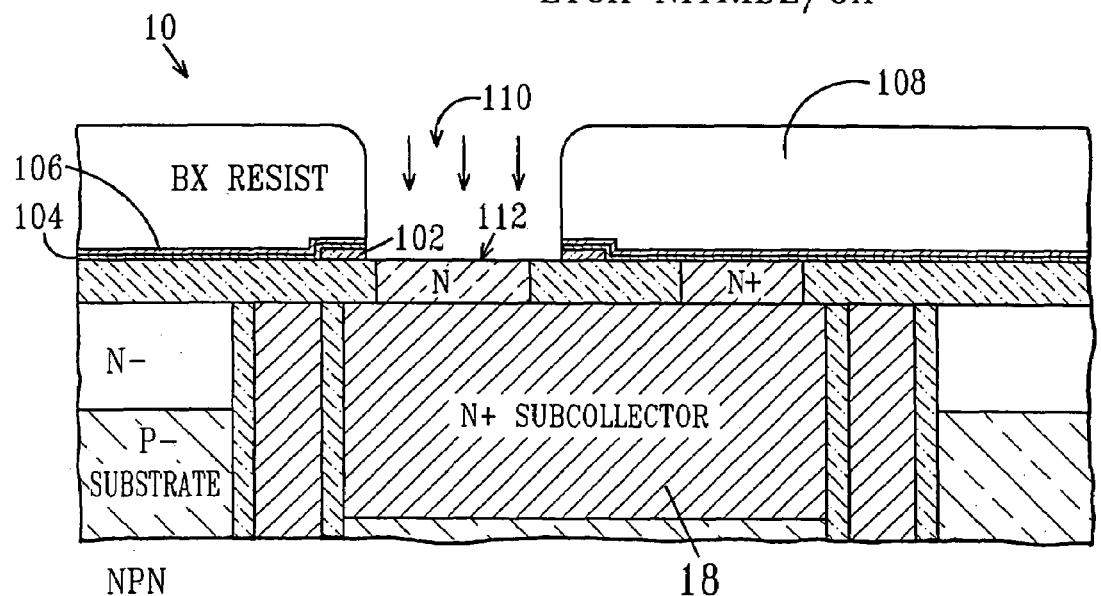

The next step is for the deep pedestal implant. FIG. 7 shows that FET protective oxide layer 102 is deposited on the semiconductor wafer 10, followed by the deposition of a polysilicon protection layer 104 and oxide layers 106. A mask is then provided including a resist layer 108. The resist layer 108, oxide layers 106, polysilicon protective layer 104, and protective oxide layer 102 may then be etched and patterned forming a region 110 within the resist layer 108. The next step is the implant of a deep pedestal 112 into the region 110. The nitride strip 56 may then be etched. The next step is to remove the resist layer.

Figure 8:
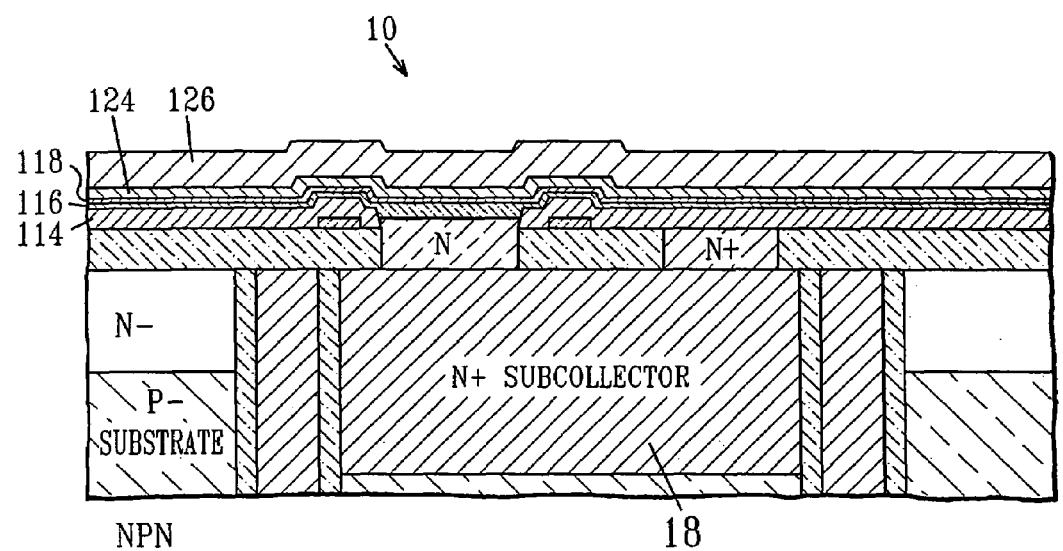

The emitter and extrinsic base is then defined. The next step is to deposit an LTE polysilicon layer 114 (e.g., NPN SiGe EPI base film) followed by the deposition of oxide and silicon layers 116, 118. This is followed by the step of growing and depositing of the emitter film layers 124, 126. FIG. 8 shows the semiconductor wafer 10 after the LTE EPI and base film deposition.

Figure 9:
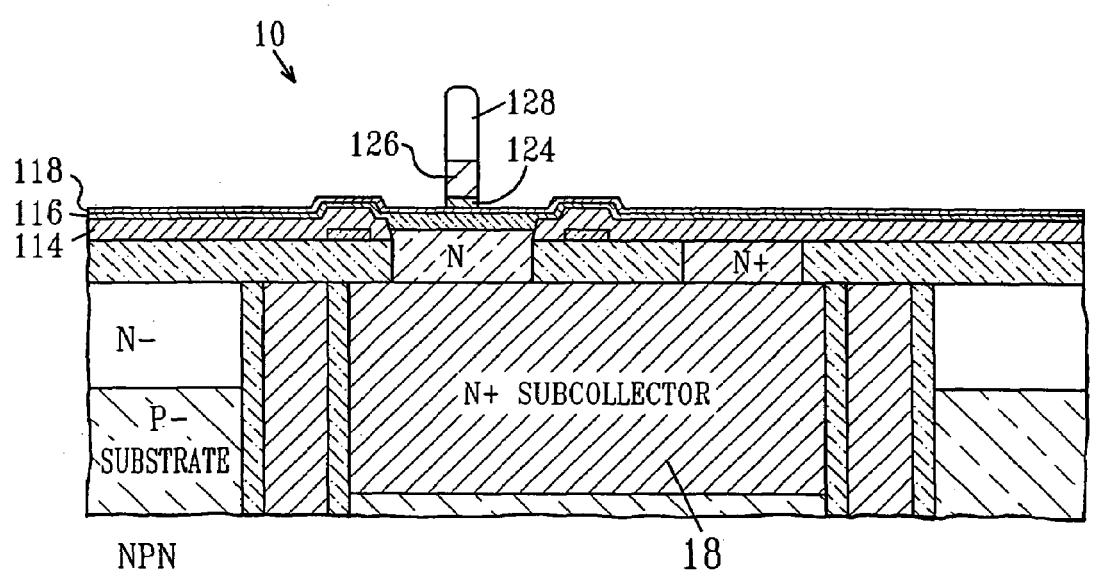
Figure 10:
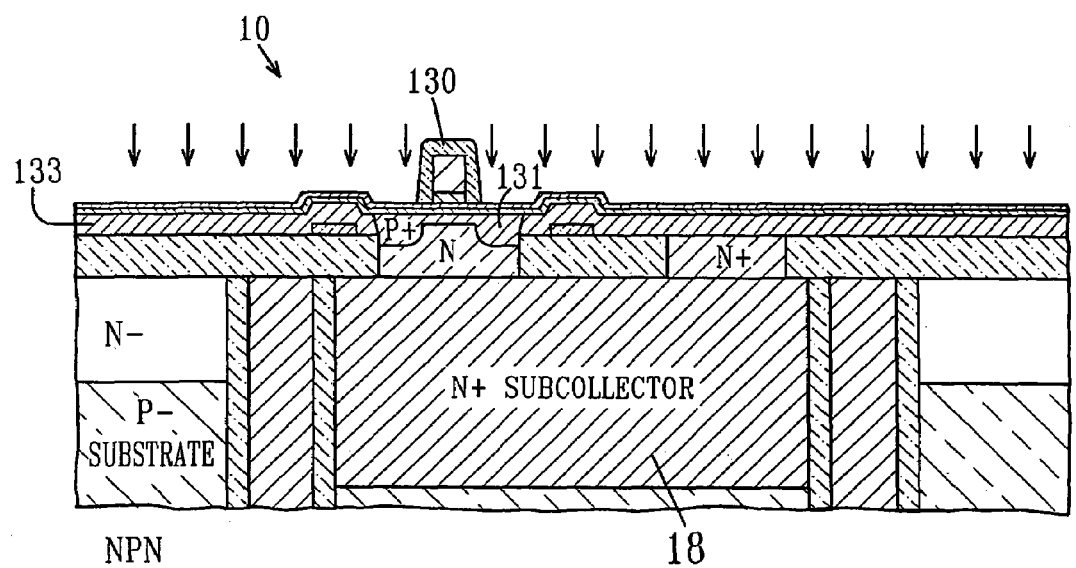

A mask including a resist layer 128 is then provided on the semiconductor wafer 10 as shown in FIG. 9. The resist layer 128 is then etched and patterned to define an emitter region 130 and extrinsic base region. The spacer is then deposited and etched to therein define an emitter-extrinsic base spacing the emitter region 130. The next step is the extrinsic base implant as shown in FIG. 10 to form the P+ region 131 and the P+ polysilicon layer 133.

Figure 11:
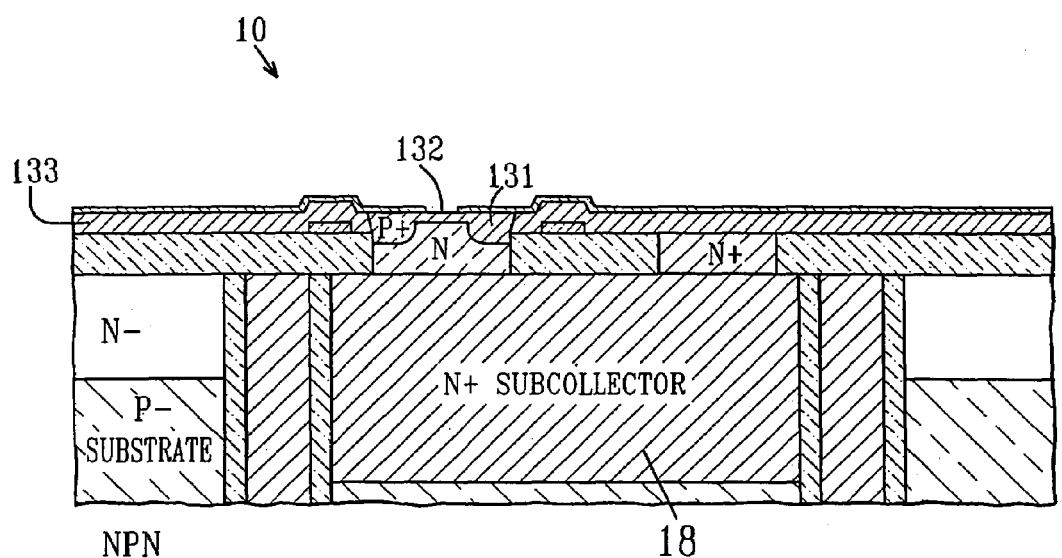
Figure 12:
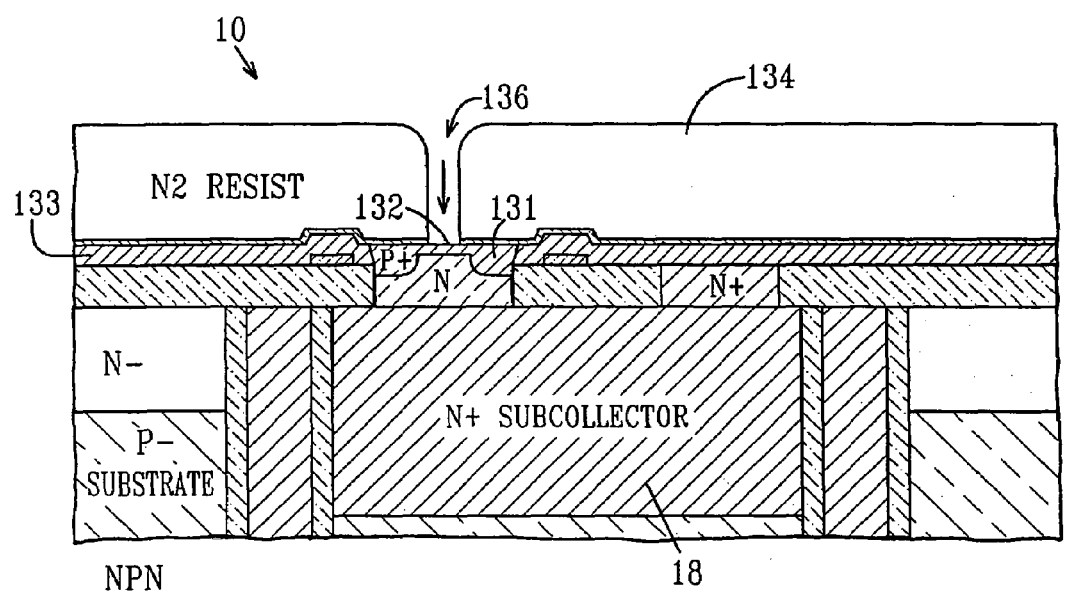

The emitter formation is then defined. FIG. 11 shows the results of the etching of the emitter opening 132. The emitter window etch is followed by a mask which includes a resist layer 134 as shown in FIG. 12. The resist layer 134 is then etched and patterned to provide an emitter window etch region 136 above the emitter opening 132. The next step is the pedestal 112 implant into the emitter opening 132. This step includes an emitter polysilicon layer deposit and the implant. The resist layer 134 is hen removed followed by providing an N+ emitter polysilicon layer 138 and the deposit of emitter films 140.

Figure 13:
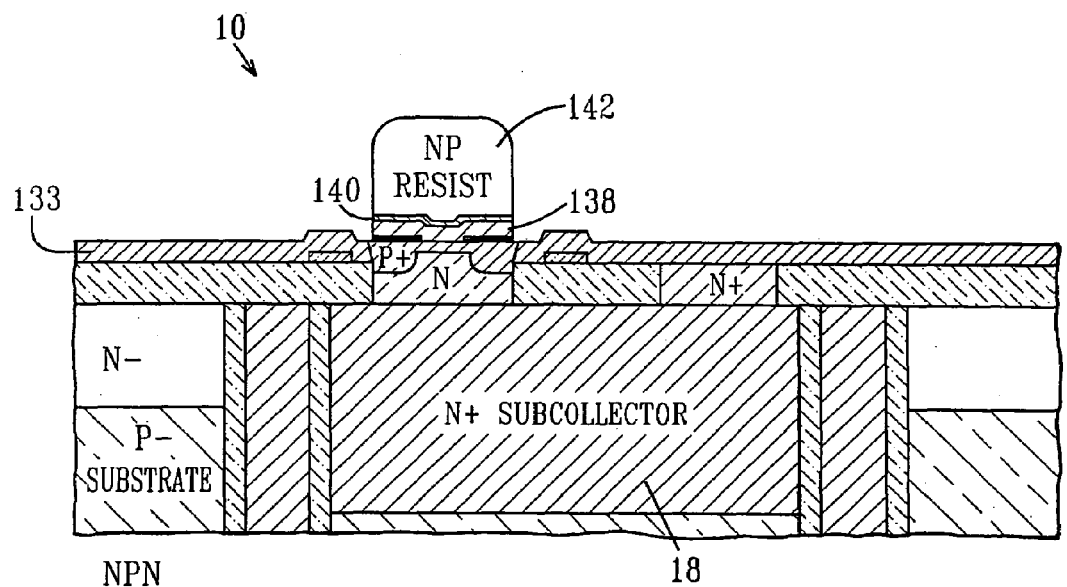

The emitter formation of the polysilicon stack is continued. A mask including a resist layer 142 is then provided (FIG. 13). The resist layer 142 may then be etched and patterned including the step of the NPN emitter polysilicon layer 138 and the etch of the emitter films 140. The remaining resist layer 142 may then be removed FIG. 13 shows that a mask including a resist layer 142 may then be provided on the semiconductor wafer 10. The mask is followed by the etching of the NPN emitter polysilicon layer 138 and emitter films 140.

Figure 14:
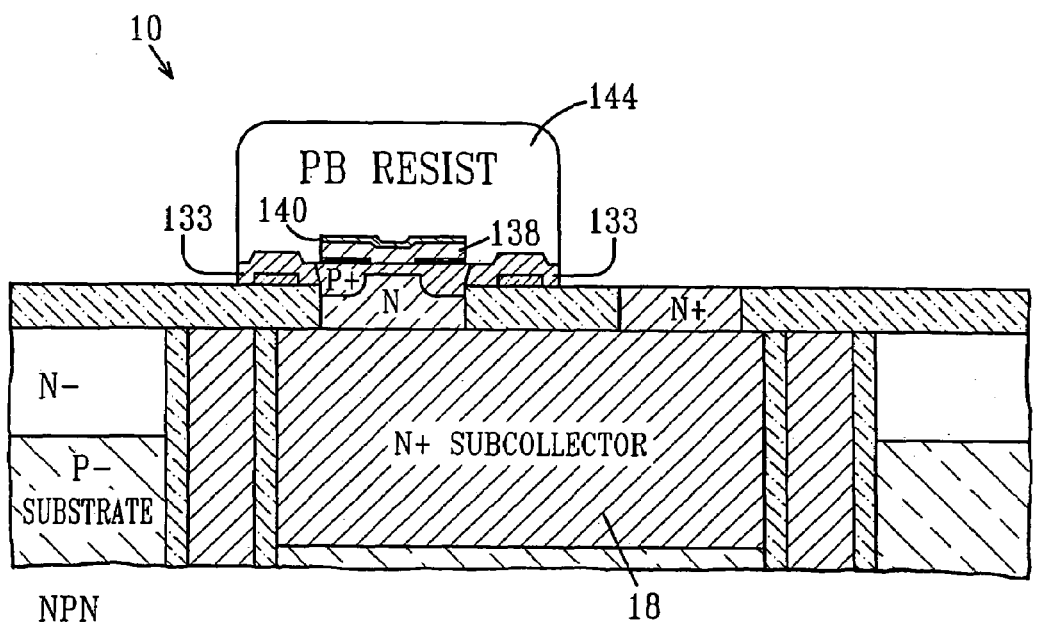

The NPN base region is then defined. FIG. 14 shows that a mask is then provided including a resist layer 144. The mask may be utilized to etch the NPN base polysilicon layer 133 and the protective oxide layer.

Figure 15:
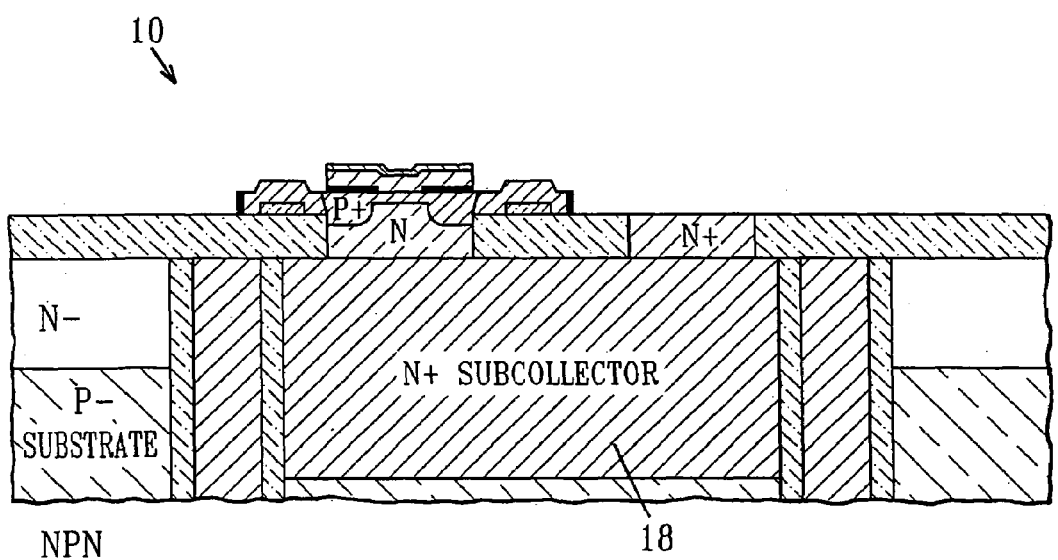
Figure 16:
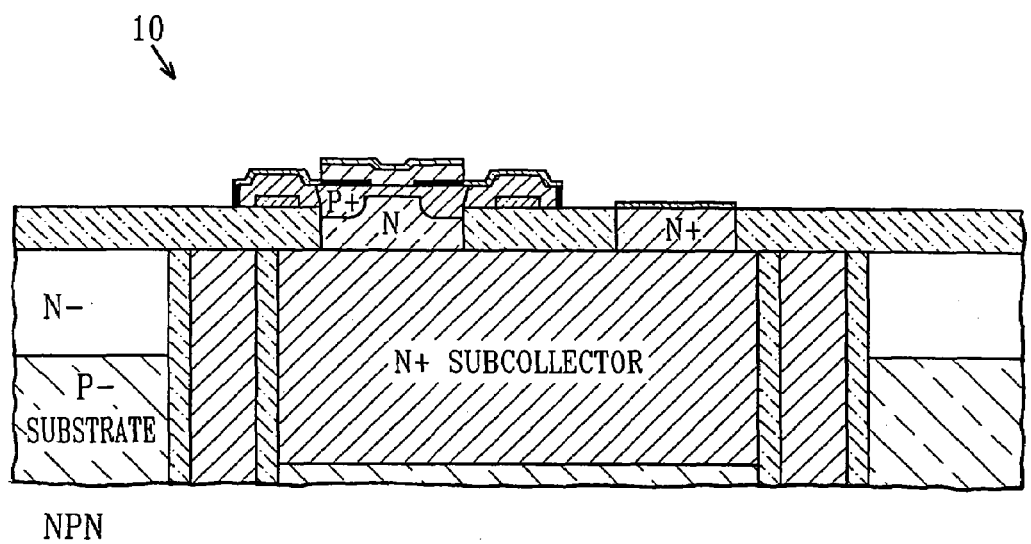
Figure 17:
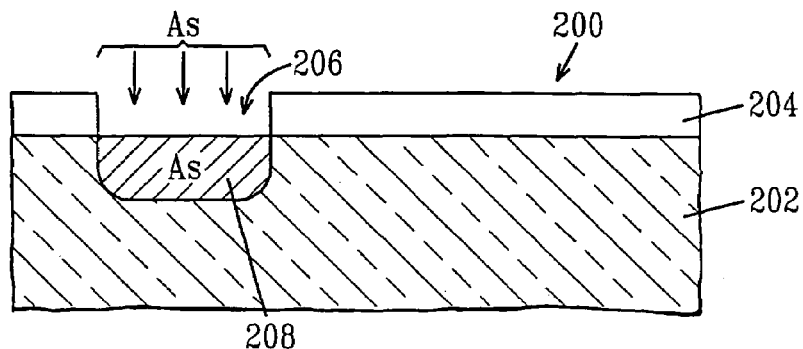
FIGS. 17-20 are schematic diagrams illustrating a device in different steps of the fabrication process of another embodiment of the present invention.

A salicide block mask is then applied. FIG. 15 shows that a mask may then be provided including a resist layer 152. The mask may be etched and patterned to form an NPN spacer and a resistor TiSix block. The patterning of the resist layer 152 is provided over the PCP resistor and N+ resistor region after etching resulting in the formation of an NPN spacer and a resistor space TiSix block and a titanium silicide. Titanium salicide is then formed. FIG. 16 shows the semiconductor wafer 10 after the TiSix formation and the removal of the resist layer 152.

Successive metal steps are then established. The semiconductor wafer 10 may include two to five levels of metal (M2 to M5) including vias (V1 to V4). The next to last metal level (MT) may include a metal-to-metal capacitor. The semiconductor wafer will also include a thick last metal layer (AM) and a last via (LV). Alternative processes such as damascene copper can also be used for interconnects.

A final mask may be provided including a polymide layer. The mask may be deposited, cured, patterned and etched before the final passivation step. The resulting structure is one embodiment of the present invention.

Figure 18:
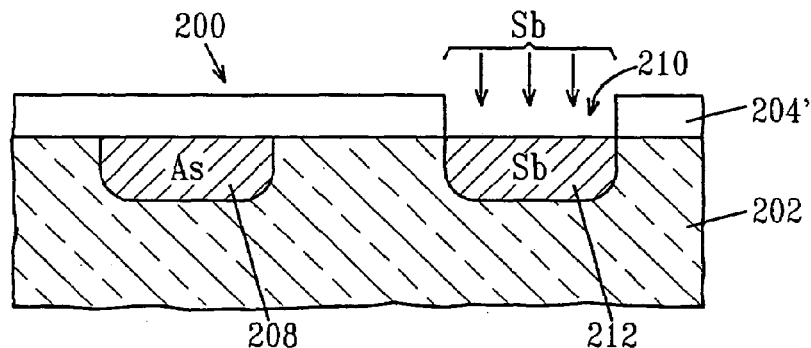
Figure 19:
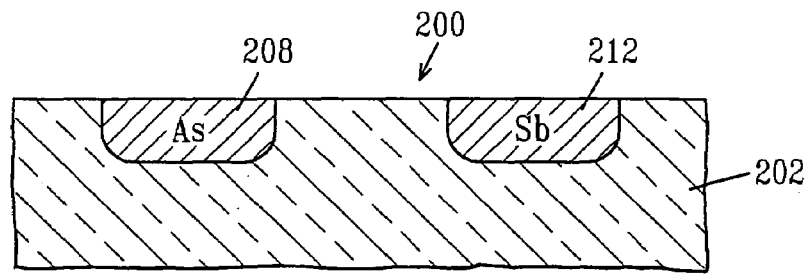

According to another embodiment of the present invention, FIGS. 17-20 show the process steps to for manufacturing of a semiconductor device having subcollectors for first and second transistors. As shown in FIG. 19 a semiconductor device 200 may include a substrate wafer 202 upon which a photoresist mask 204 is provided to define a first subcollector region 206 for a first transistor. The first subcollector region 206 is implanted with a dopant, for example, Arsenic (As), to therein form a first subcollector 208.

As shown in FIG. 18, a second photoresist layer 204' may then be provided that defines a second subcollector region 210 for a second transistor. The second subcollector region 210 may be implanted with a dopant, for example, Antimony (Sb), to therein form a second subcollector 212. Alternately, the first subcollector 206 may be exposed to resist 204', so that region 206 receives by As and Sb while region 210 receives only Sb. As such, first and second subcollectors 206, 212 differ in impurity type or combinations of impurity type, so that one transistor has a higher resistance and a higher collector base breakdown voltage than the other.

Figure 20:
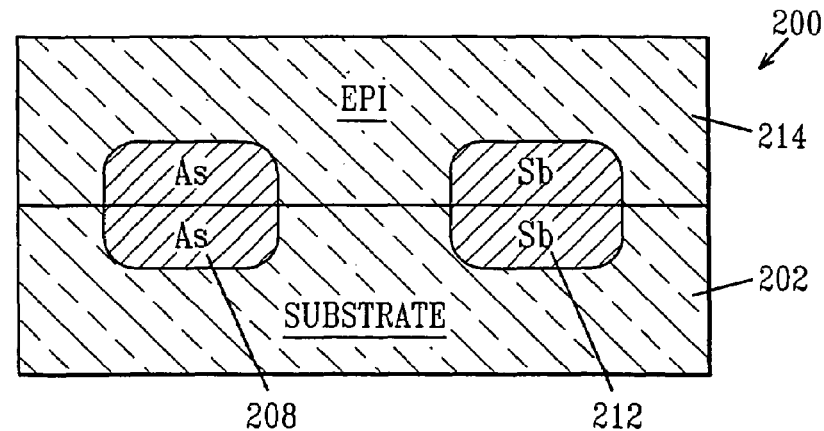

The next step is to remove the photoresist layer 204' as shown in FIG. 19. The removal of the photoresist layer 204' may be followed by an epitaxial growth step by forming an epitaxy on the first and second subcollectors 206, 212 including layer 214 as shown in FIG. 20. However, the step of epitaxial growth is not required.

An isolation structure (not shown) is then formed using conventional techniques on at least one subcollector region 208, 212. A SiGe or SiGeC film is then formed using conventional techniques on the wafer surface fox formation of a transistor base region. Finally, an emitter structure is then formed on the SiGe or SiGeC film.

Alternately, the subcollector doses may differ in doping concentration. To provide the desired differentials in performance, the levels of the doping concentrations should differ by at least one order of magnitude. For example, in one embodiment of the present invention, the As dose for subcollector 208 is on the $1 \times 10^{16}$ cm$^{-2}$ range, and second subcollector 212 may be implanted with As at a dose in the $1 \times 10^{15}$ cm$^{-2}$ range.

Figure 21:
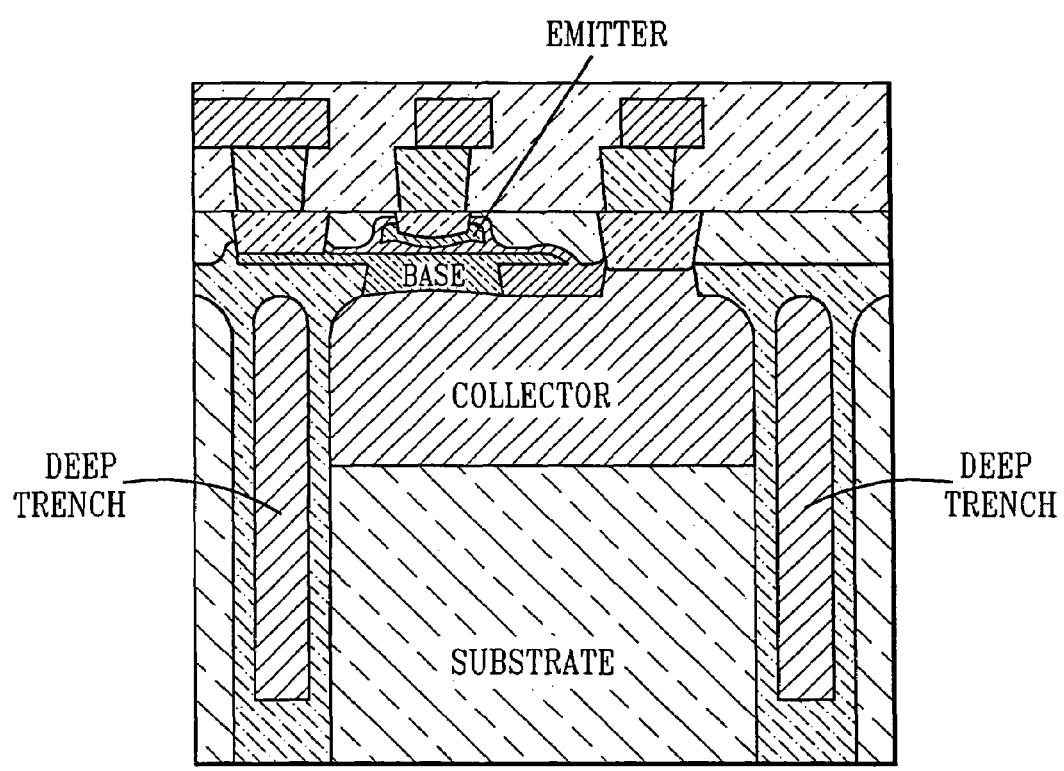
FIG. 21 is a diagram of a further embodiment of the present invention which shows a cross section of an epitaxial graded Germanium-base Silicon Germanium (SiGe) heterojunction bipolar (HBT) device with a polysilicon deep trench isolation.

The features of the invention were more thoroughly explored by carrying out a series of experiments on the HBT shown in FIG. 21. Note, for ease of illustration a single device is shown; in practice, the experimental chip was fabricated in accordance with the teachings of the invention, so that it had HBTs with differing subcollectors (in this case differing in dopant concentrations). More specifically, using UHV/CVD processing, SiGe was deposited in the base region over single-crystal silicon and shallow trench isolation (STI) structure. The Ge concentration was varied during the film deposition process for profile and device optimization of the SiGe HBT base region. The epitaxial region formed a single-crystal SiGe intrinsic base and an amorphous poly-SiGe extrinisic base region. A window was formed over the single crystal intrinsic SiGe base region to form the n-type polysilicon emitter. Interconnection to the emitter, base and collector was defined by a tungsten (W) local interconnect. Interlevel dielectrics, tungsten contacts, and aluminum interconnects were formed with the reactive ion etching (RIE) and chemical mechanical polishing (CMP) processes used in conventional CMOS technologies.

Figure 22:
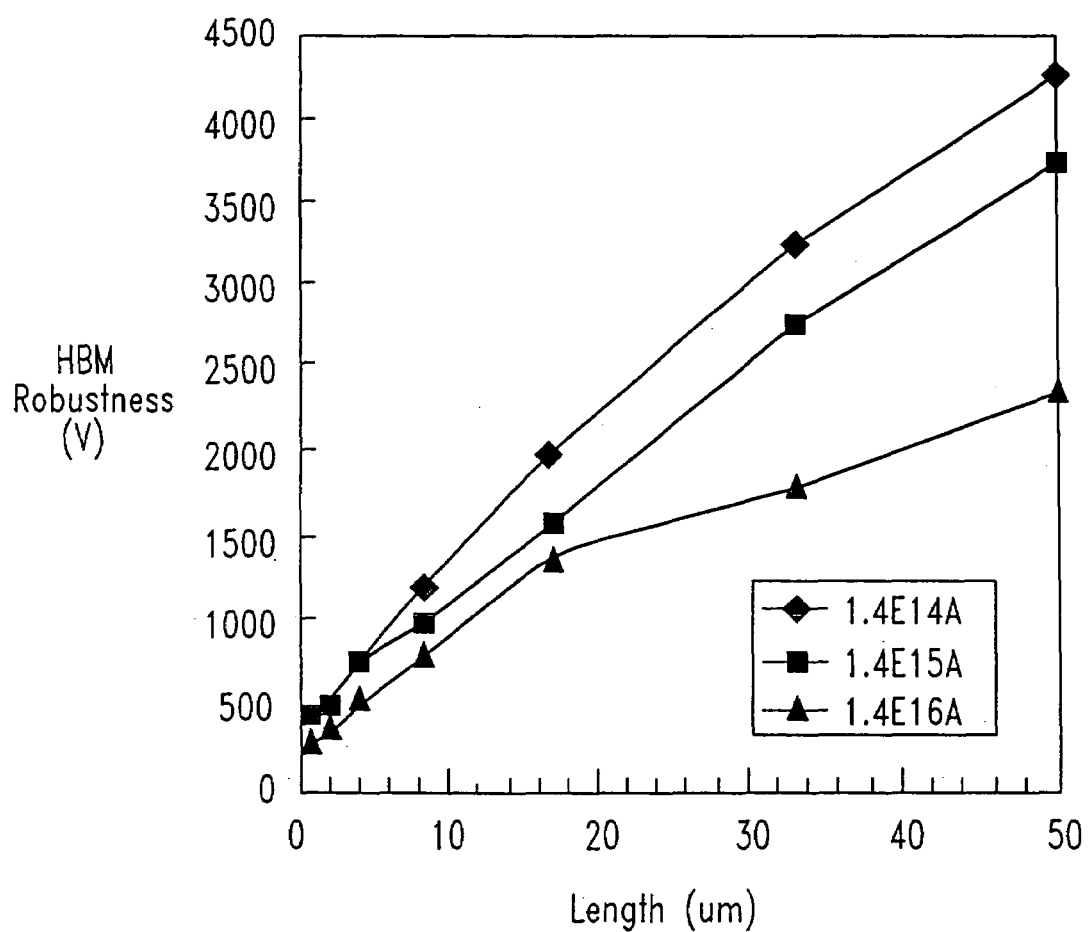
FIG. 22 shows the base-collector ESD robustness of SiGe HBT for different epitaxial Arsenic (As) subcollector doses.

Experiments wore performed on the structure shown in FIG. 21 to explore the effect of subcollector doping concentration on SiGe HBT device human body model (HBM) ESD robustness, and the linearization with structure size due to a subcollector lateral resistor ballasting effect at high subcollector sheet resistances. By "ballasting," we refer to the operation of the subcollector in inhibiting the lateral redistribution of current. The lateral subcollector ballasting effect was demonstrated by both doping concentration and dopant type. The experimental results show the effects and role of the subcollector in high current applications and ESD events. In addition, the experimental results show a small impact on the optimum unity current gain cutoff frequency ($f_T$) and the unity power gain cutoff frequency $f_{(MAX)}$. The experimental results also show the tradeoff between $f_T$, $f_{(MAX)}$, and ESD for an SiGe device. For example, FIG. 22 shows the base-collector ESD robustness of SiGe HBT for different epitaxial subcollector doses. For example, FIG. 40 shows the ESD robustness of a SiGe HBT for epitaxial As and Sb subcollectors.

FIG. 22 illustrates the ESD results in a base-collector configuration of a SiGe HBT 0.32 μm emitter width as a function of the emitter length, where the subcollector is As-doped at varying concentrations. The experimental results show that the ESD results improve as a function of emitter length, though not linearly. However, as the doping concentration of the subcollector decreases, ESD robustness improves with emitter length in a more linear fashion. This is because the higher sheet resistance provides lateral subcollector ballasting within the subcollector region. At high current, non-uniform self heating along the current structure leads to current redistribution along the length of the structure. The experiments show that higher sheet resistance subcollectors inhibit the lateral redistribution of the current. This leads to a linear scaling with the size of the transistor structure.

Figure 23:
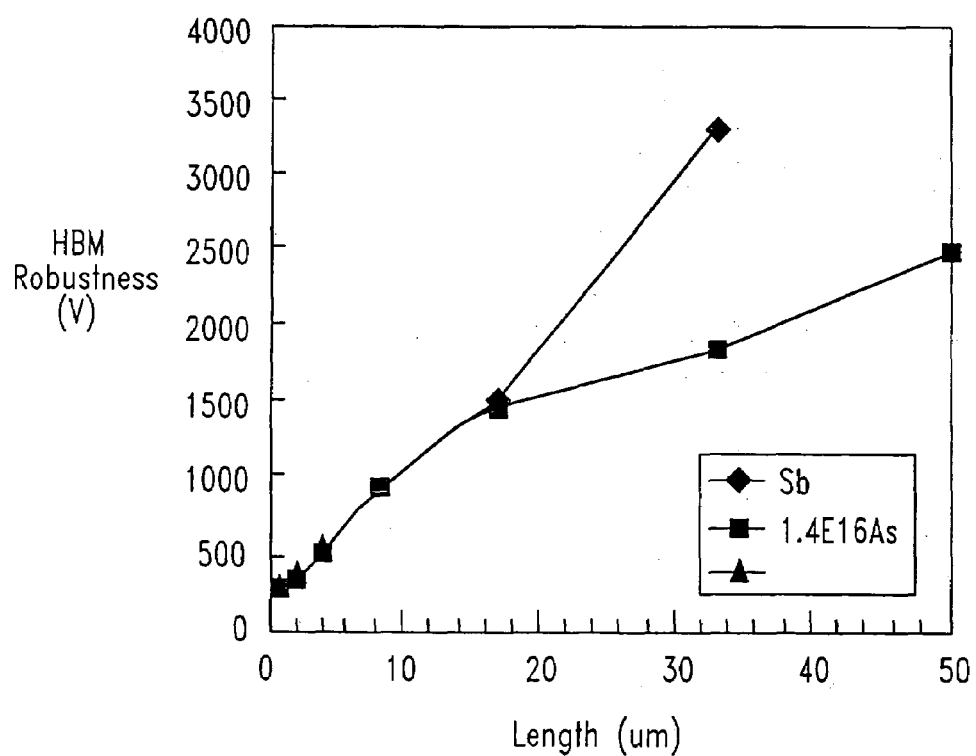
FIG. 23 shows the ESD robustness of a SiGe HBT for epitaxial Arsenic (As) and Sb subcollectors.

FIG. 23 shows the results of a second study using Sb as the subcollector which shows this same effect and net improvement. With a 80 Ω/square subcollector, ESD results were superior to the 8 Ω/square subcollector (e.g., $1 \times 10^{16}$/cm$^{-2}$) and showed improved ESD linearity. One reason for the improvement is postulated to be related to the fact that the high doped region of the Sb subcollector is farther away from the base-collector junction preventing diode shorting as well as the reason that the dopants Sb do not diffuse as far as arsenic for a given self heating temperature. Additionally it is postulated that the volumetric region which is undergoing self-heating is physically larger. Another physical reason is that the subcollector has more natural resistive ballasting laterally along the length of the collector providing a better scaling with varactor length.

FIG. 24 shows the ESD results of an Sb SiGe varactor structure versus an As SiGe varactor for a positive HBM pulse. For negative pulses it is noted that the Sb subcollector ESD results are superior to the As subcollector in its magnitude and scaling dependence. The Sb subcollector breakdown voltages are at least three times better that the As subcollector which is important for RF applications when this structure is used in a forward or reverse configuration for ESD devices. FIG. 25 shows the ESD results of an Sb SiGe varactor structure versus an As SiGe varactor for a negative HBM pulse.

In the invention, the varying subcollectors may be part of a transistor, bipolar transistor, a Schottky barrier diode, a PIN diode, a p+/subcollector diode, a p+/n-well/subcollector diode, a pn diode or a varactor. Moreover, in the invention an additional diffusion may optionally be included abutting the first subcollector and/or second subcollector. The additional diffusion may include a "pedestal" implant (i.e. an implant that abuts the subcollector and is formed by implantation through the emitter window in the collector region) and/or a reachthrough diffusion. The first subcollector and/or second subcollector may also have an edge defined by a step (e.g. by an STI region).

Figure 26:
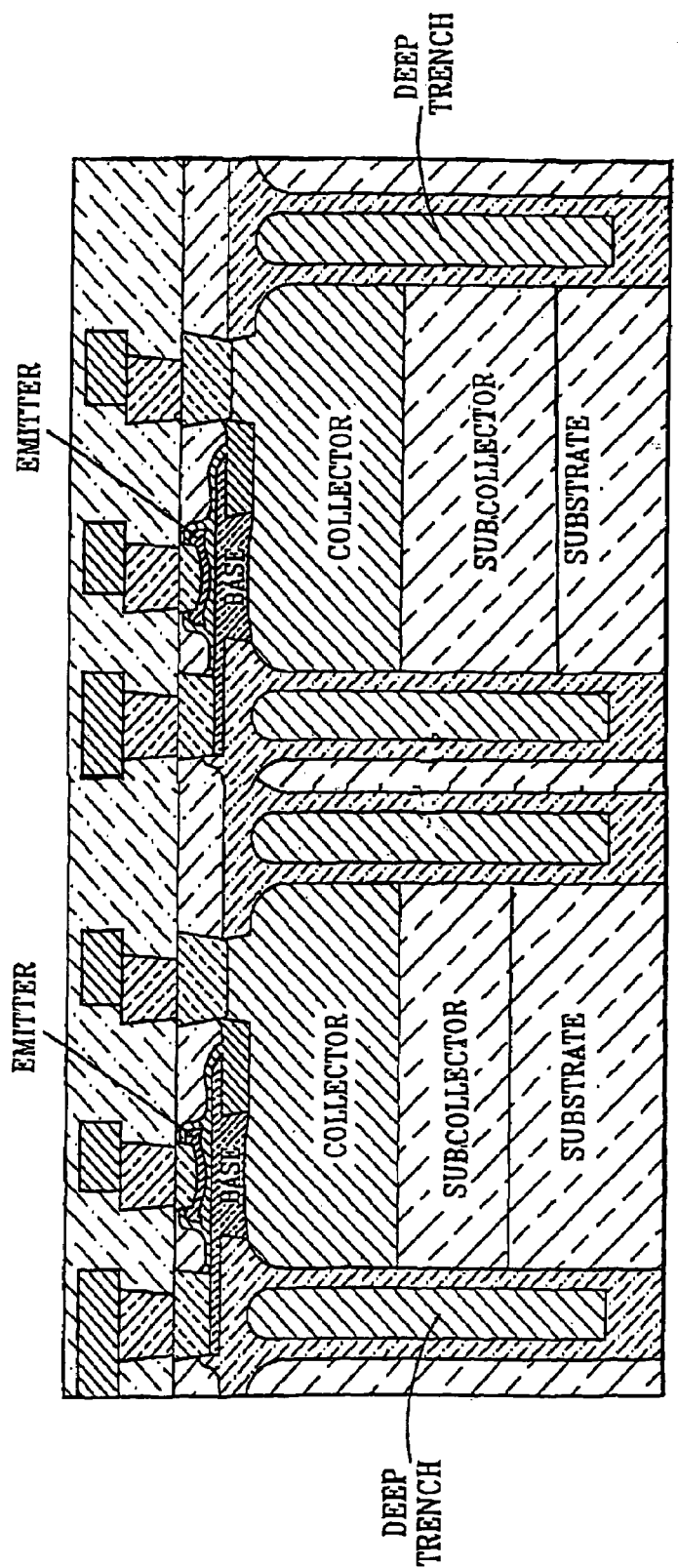
FIG. 26 shows two SiGe HBT bipolar transistors with different subcollectors.

In the present invention, a first bipolar transistor comprising a first subcollector and a second bipolar transistor comprising a second subcollector are formed on a common substrate as exemplified by FIG. 26. The second subcollector differs from the first subcollector in impurity type and/or doping concentration, and/or in any other fashion that results in a marked differential in sheet resistance. For example, the first subcollector may comprise an implant does in the $1 \times 10^{16}$ cm$^{-2}$ range and the second subcollector may comprise an implant does in the $1 \times 10^{15}$ cm$^{-2}$ range. Sheet resistance of the $1 \times 10^{16}$ cm$^{-2}$ dose is typically 10 Ω/square whereas $1 \times 10^{15}$ cm$^{-2}$ is near 100 Ω/square. As such, the second subcollector provides a higher resistance and a higher collector base breakdown voltage than the first subcollector. As a practical matter, this resistance differential can be increased by reducing the concentration of the second subcollector still further—e.g. to $1\times10^{14}$ cm$^{-2}$ and below. However, the best tradeoff between introducing a sufficient differential in resistance without reducing overall transistor performance appears to be keeping the first subcollector at a resistivity of about 5-20 Ω/square, and the second at 50-200 Ω/square, respectively.

The invention may be applied to various integrated circuit structures and substrates. For example, the invention may be applied to epitaxial or non-epitaxial substrate, or to HBTs with Si, SiGe, or SiGeC bases. The base region may comprise a "raised base device". The emitter may be a self-aligned emitter, non-self aligned emitter, or a quasi-self aligned emitter. The higher sheet resistance subcollectors may be applied to devices utilized to provide thermal stability, ESD protection, or a high-power device operations for improved power-to-failure. In particular, ESD protection may be provided by high sheet resistance subcollectors in diodes, varactors, or Schottky elements.

In still a further embodiment according to the present invention, a semiconductor structure may comprise a first transistor comprising a substrate, an As subcollector, an n–epi collector, a SiGe polysilicon p–doped extrinsic base, and a SiGe silicon single crystal intrinsic base; and a second transistor comprising a p–substrate, an Sb subcollector, a n–epi collector, an SiGe polysilicon p–doped extrinsic base, an SiGe silicon single crystal intrinsic base; where the first and said second transistors exist on the same substrate and where said second structure is used for ESD protection.

Figure 27:
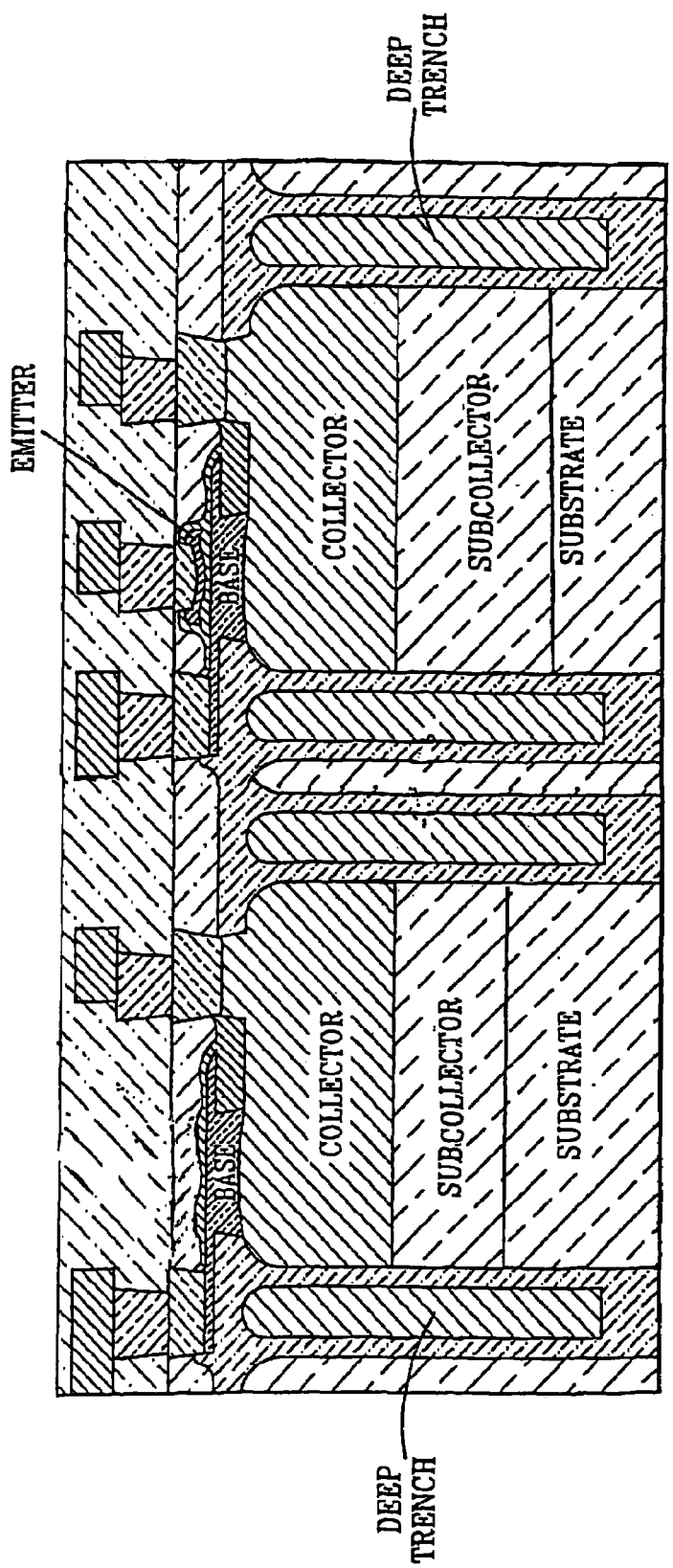
FIG. 27 shows an SiGE varactor and SiGe HBT NPN transistor.

The invention may be applied to various integrated circuit structures and substrates. For example, the invention may be applied to epitaxial or non-epitaxial substrate, or to HBTs with Si, SiGe, or SiGeC bases. The base region may comprise a "raised base device". The emitter may be a self-aligned emitter, non-self aligned emitter, or a quasi-self aligned emitter. The higher sheet resistance subcollectors may be applied to devices utilized to provide thermal stability, ESD protection, or a high-power device operations for improved power-to-failure. In particular, ESD protection may be provided by high sheet resistance subcollectors in diodes, varactors, or Schottky elements as exemplified in FIG. 27.

The present invention can be practiced by formation of implanted subcollectors without epitaxial growth. Hence an implanted subcollector can be formed using an Arsenic subcollector implant step and an Antimony subcollector implant step. This is followed by activation steps to activate the dopants. These and other modifications to the foregoing teachings may be made by persons of skill in the art without departing from the spirit and scope of the present invention as set forth in the accompanying claims.

What is claimed is:

1. A method for manufacturing a semiconductor device on a wafer comprising the following steps:
   forming a first subcollector region in the wafer;
   forming a second subcollector region in the wafer; wherein the second subcollector differs from the first subcollector;
   forming an isolation structure abutting an end portion of at least one subcollector region;
   forming a SiGe film or SiGeC film on the wafer surface above said first and second subcollector regions for formation of a transistor base region;
   forming an emitter structure on the SiGe or SiGeC film.

2. The method of manufacturing a semiconductor device of claim 1, wherein the first subcollector implant differs from the second subcollector region in impurity type or doping concentration.

3. The method of manufacturing a semiconductor device of claim 1, wherein a first bipolar transistor is formed on said first subcollector region and a second bipolar transistor is formed on said second subcollector region.

4. A method of manufacturing a semiconductor device on a wafer comprising the following steps:
   forming a subcollector region by implantation of the wafer with a first dopant and with a second dopant;
   forming an isolation structure on the subcollector region;
   forming a SiGe film or SiGeC film on the wafer surface for formation of a transistor base region;
   forming an emitter structure on the SiGe or SiGeC film.

* * * * *